United States Patent [19]

Hart

[11] Patent Number: 5,822,339

[45] Date of Patent: Oct. 13, 1998

[54] DATA DECODER AND METHOD TO CORRECT INVERSIONS OR PHASE AMBIGUITY FOR M-ARY TRANSMITTED DATA

[75] Inventor: Billy D. Hart, Cedar Rapids, Iowa

[73] Assignee: Rockwell International, Costa Mesa, Calif.

[21] Appl. No.: 655,535

[22] Filed: May 30, 1996

[51] Int. Cl.⁶ .......................... H03M 13/00; G06F 11/00; H04L 7/00; H04L 25/40

[52] U.S. Cl. ............................ 371/42; 371/47.1; 375/371

[58] Field of Search ................ 371/42, 43.5, 46, 371/37.01, 37.12, 47.1; 375/354, 375

[56] References Cited

U.S. PATENT DOCUMENTS

| | | | |
|---|---|---|---|
| 3,577,186 | 5/1971 | Mitchell | 371/42 |
| 3,648,239 | 3/1972 | Carter et al. | 371/37.7 |
| 3,697,949 | 10/1972 | Carter et al. | 371/40.11 |
| 3,806,647 | 4/1974 | Dohne et al. | 375/281 |
| 4,328,587 | 5/1982 | Mizuno et al. | 375/344 |
| 4,466,099 | 8/1984 | Meltzer | 371/47.1 |
| 4,712,216 | 12/1987 | Glaise | 395/182.04 |
| 4,959,834 | 9/1990 | Aikawa et al. | 371/47.1 |
| 5,025,455 | 6/1991 | Nguyen | 375/327 |
| 5,027,357 | 6/1991 | Yu et al. | 371/37.7 |
| 5,084,891 | 1/1992 | Ariyavisitakul et al. | 371/42 |
| 5,200,961 | 4/1993 | Karasawa et al. | 371/37.4 |
| 5,208,815 | 5/1993 | Kojima | 371/37.7 |
| 5,278,845 | 1/1994 | Reintjes et al. | 371/42 |
| 5,566,184 | 10/1996 | Ooi | 371/5.1 |

*Primary Examiner*—Paul P. Gordon
*Assistant Examiner*—Robert J. Dolan
*Attorney, Agent, or Firm*—Kyle Eppele; James P. O'Shaughnessy

[57] ABSTRACT

The invention is a way to detect and correct data inversions or other phase ambiguities in a modem's data, without incurring a significant penalty in error rate performance, throughput, or overhead, by making a particular use of the error detection and correction (EDAC) code which would typically be used for random errors. The decoder is set up so that the inverted data or out-of-phase data generates a distinctive syndrome which signals to a phase corrector.

9 Claims, 3 Drawing Sheets

| ERRORS | CODE WORDS (TOP ROW) | | | | | |
|---|---|---|---|---|---|---|
| 000000 | 110100 | 011010 | 101110 | 101001 | 011101 | 110011 | 000111 |
| 000001 | 110101 | 011011 | 101111 | 101000 | 011100 | 110010 | 000110 |
| 000010 | 110110 | 011000 | 101100 | 101011 | 011111 | 110001 | 000101 |
| 000100 | 110000 | 011110 | 101010 | 101101 | 011001 | 110111 | 000011 |
| 001000 | 111100 | 010010 | 100110 | 100001 | 010101 | 111011 | 001111 |
| 010000 | 100100 | 001010 | 111110 | 111001 | 001101 | 100011 | 010111 |
| 100000 | 010100 | 111010 | 001110 | 001001 | 111101 | 010011 | 100111 |
| 111111 | 001011 | 100101 | 010001 | 010110 | 100010 | 001100 | 111000 |

Fig. 3

DATA DECODER AND METHOD TO CORRECT INVERSIONS OR PHASE AMBIGUITY FOR M-ARY TRANSMITTED DATA

FIELD OF INVENTION

The present invention relates generally to digital communications, and more particularly is a system to solve phase ambiguity and data inversions in certain types of modulated carrier data signals.

BACKGROUND OF THE INVENTION

Well known coding theory provides guidance in developing Error Detection and Correction code design that achieves minimal random bit-error-rate (BER) with respect to the length of the given code.

In addition to random bit errors, many implementations of data modems must deal with an ambiguity in the demodulated data stream due to possible inversions. In the case of M-PSK data, the ambiguity is M possible phase positions in the recovered carrier reference.

Several methods exist for dealing with this ambiguity; however, all have one or more drawbacks such as increased random error rate, reduced throughput, or significant processing overhead. Alternatively, differential decoding is commonly used as a way to avoid the phase ambiguity. Differential decoding is simple to accomplish, but on the average doubles the bit error rate. As another alternative, a Miller code waveform is sometimes used, but requires a significantly higher signal-to-noise ratio than more common waveforms. Yet another alternative is the use of a preamble for each transmission, used to set phase. Preamble coding does not however avoid the deficiencies with recovery from noise burst signal corruption. Duplicate error-detection-and-correction ("EDAC") decoding can be used, operating on the received data at each possible phase with selection of only the data output having a reasonable error rate. This may require duplication of a significant amount of hardware.

Accordingly, there exists a need for an improved system for coding, transmitting and decoding data messages.

SUMMARY OF THE INVENTION

The present invention constitutes a system for transmitting and concurrently processing received code data in a structured fashion that provides for the largest number of detectable or correctable random bit errors while also correcting a possible data inversion. The system of the present invention comprises an information source, a source encoder, a channel encoder and a digital modulator coupled in a cascade fashion. A transmission channel carries the modulated, encoded information to a digital demodulator, a channel decoder and a source decoder, which are also cascadely coupled.

The channel encoder and decoder utilize a methodology in which for any given M-ary code a given number of syndromes are dedicated to resolving the most frequently occurring errors as determined in accordance with standard coding theory. A small portion of the code capacity is reserved and dedicated to data inversion or phase ambiguity identification and/or correction.

An alternate embodiment of the invention is the utilization of code syndromes to identify and correct data inversions simultaneously with random bit errors, at the expense of random bit errors within the field of the less frequently occurring errors. The justification for such sacrifice of code function is predicated upon the necessity to have processed information in proper phase in spite of bit errors within the coded signal.

It is an object of the present invention to provide a simplified system for accurately and efficiently accomplishing data communications.

It is a feature of the present invention to utilize an error correction code in a data communication system that concurrently identifies a fixed number of random bit errors and phase ambiguities.

It is yet another feature of the present invention to utilize an error correction code that corrects for phase ambiguities.

It is an advantage of the present invention to provide the maximum accurate data throughput of coded data, while utilizing minimal processing resources.

These and other objects, features and advantages are disclosed and claimed in the specification, figures, and claims of the present application.

BRIEF DESCRIPTION OF THE DRAWINGS

FIG. 3 is a decoding table of a decoder scheme implementing one embodiment of the present invention.

DESCRIPTION OF THE PREFERRED EMBODIMENT

Figure 1:
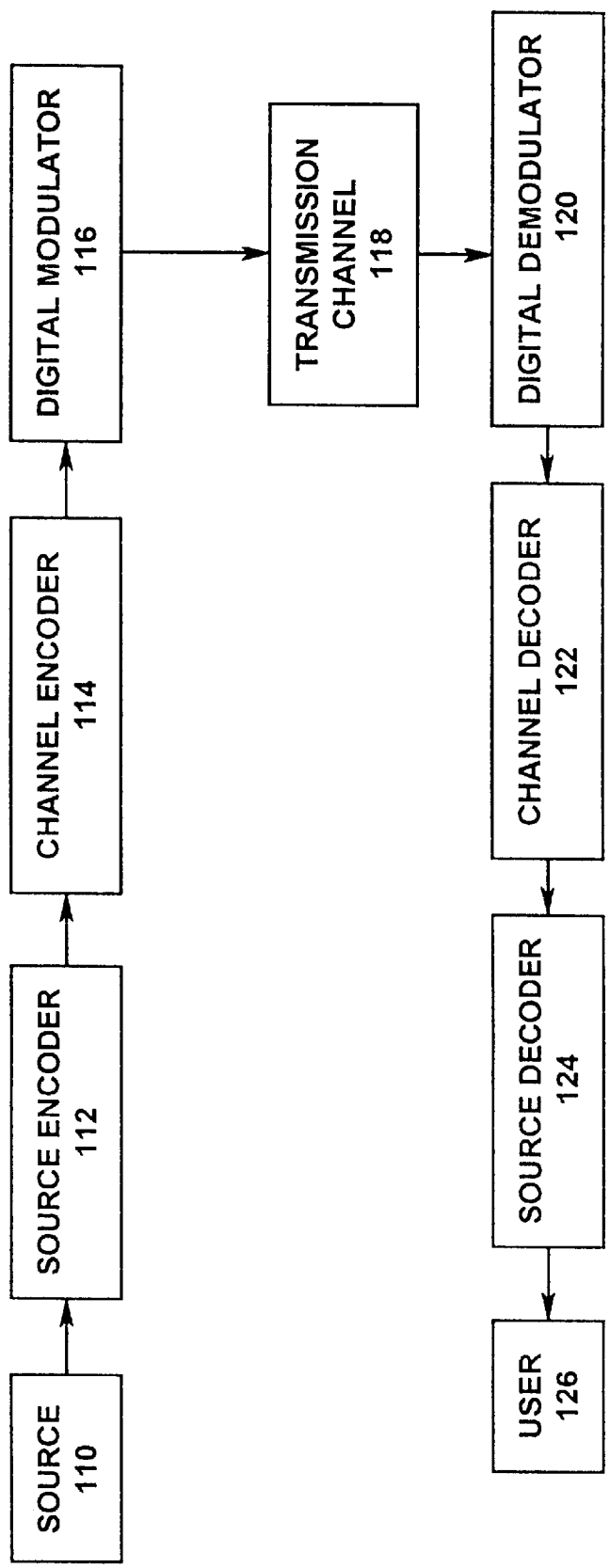
FIG. 1 illustrates a block diagram of a digital communication system as known in the prior art.

Referring now to the drawings, wherein like items are referenced as such throughout, FIG. 1 illustrates a one-way digital communication system 100, as known in the prior art. An information source 110 provides a message that is to be transmitted to a user 126. The information may be either analog or discrete. The information is coded into compact digital format via a source encoder 112. After passing through the source encoder 112, the output signal of the source encoder is coupled to a channel encoder 114. The channel encoder 114 transforms the digital output of the source encoder into the proper format for subsequent modulation for the specific channel of the system 100. The channel encoder 114 in essence adds redundancy by converting a block of k binary signals (or non-binary symbols for M-ary systems) to a longer block of n symbols. In some cases, the encoder 114 may receive k-symbol blocks of information, and append checking symbols, thereby forming a code block of N symbols; N and K both being integers. In other cases the K information symbols are not a distinct segment of the code word.

The digital modulator 116 receives as its input, the coded binary information of the channel encoder and applies sufficient energy to the information enabling each coded data block to be transmitted through a transmission channel 118, over a distance to a corresponding digital demodulator 120.

The digital demodulator 120 converts the transmitted signal into a corresponding code block and passes the code block to a channel decoder 122 for further processing. The channel decoder 122 performs the opposite function of the channel encoder, thereby yielding the coded information. A source decoder 124 then converts the binary information into a previously determined format and provides such information to the user 126.

Figure 2:
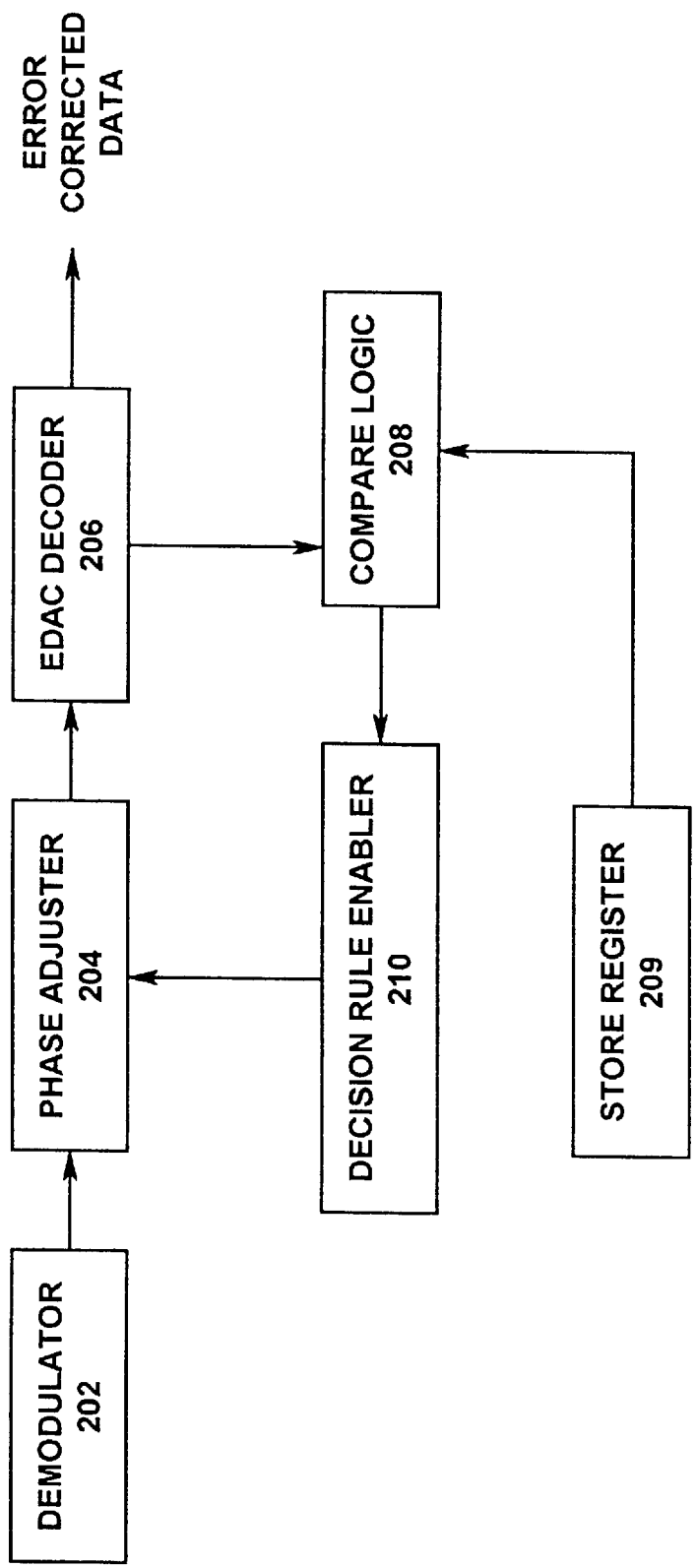
FIG. 2 illustrates a block diagram of a digital communication system incorporating the teachings of the present invention.

FIG. 2 illustrates that portion of a digital communication system that comprises the present invention, being principally the channel decoder 122 of FIG. 1. A demodulator 202, as described in FIG. 1, is coupled to a phase adjuster 204. The phase adjuster 204 has its output signal coupled to an error dection and correction decoder 206, which in turn is coupled to additional processing means (see FIG. 1) and compare logic 208. The compare logic 208 receives an additional input signal from a storage register 209. A decision rule enabler 210 receives an input signal from the compare logic 208 and has its output signal coupled to the phase adjuster 204.

The invention, as shown in FIG. 2, corrects the condition of inverted data, all bits in error, or otherwise out-of-phase data generally for M-ary codes, by making use of an EDAC code and utilizing the unique syndromes which are generated under the out-of-phase conditions. Syndromes are generated in the normal course of the decoding process for many codes. EDAC decoder 206 may be the same channel decoder 122 used in the communication system of the prior art. The syndrome is compared to the syndrome in register 209 for the out-of-phase condition and when equality is found for some number of code words, such as one, two, or three, a decision is made by the decision rule enabler 210 and executed to reverse the phasing in phase adjuster 204.

Any EDAC code may be used in this manner if the syndrome differs from that of the correct data for each possible out-of-phase condition. A code will perform best in this process if those syndromes are different from syndromes of the most common random error patterns (ex. single or few bit errors). The technique can be used with a decoder which gives error detection, correction, or a combination of both.

With some decoder implementations, the above scheme gives erroneous output data until the decision has been made to correct the phase. That scheme is useful, but may be improved upon by a decoder 206 which corrects the out-of-phase error patterns, as well as random error patterns. Then correct data will be obtained even before the decision rule is met and the phase of the information is readjusted. The phase corrector is still needed because the code will usually not be able to correct as many random errors when the out-of-phase conditions exist.

Most codes in use today allow decoders to correct all error patterns with some number of errors, such as T and only some patterns with more than one T errors. The extra syndromes left after accounting for error patterns up to T errors are typically used to detect or correct some of the T+1 error patterns, but this is rather arbitrary and yields negligible improvements in bit error rate if only a small fraction of such patterns can be accomodated. Thus, there is negligible random BER penalty for reassigning M-1 syndromes for the purpose of correcting out-of-phase conditions instead of T+1 errors.

If the code does not have enough extra syndromes beyond T errors, then some of the T-error patterns may be reassigned with a small error rate penalty. In the case of decoding having many syndromes available, it may be desirable to assign syndromes to correct out-of-phase conditions, plus simultaneous random error patterns having only one or a few errors. Assigning syndromes to correct as many errors when out-of-phase, as when in-phase is possible but may hurt overall BER performance against only random errors.

An example of a suitable simple code and decoding table is shown in FIG. 3. This simple 6,3 block code can correct all single errors T=1 in a block of 6 bits. It can also correct one other error pattern, which can be any pattern in the bottom row. The example illustrates the all-bits in error pattern, although other alternatives, such as a double error pattern, could also be chosen as a correctable error pattern.

Thus, if the data is inverted, the syndrome will be that syndrome corresponding to the error pattern (111111) and the detector will signal the phase adjuster that this condition has occurred. The phase adjuster could immediately be switched to invert the following data words ahead of the decoder, but it is usually desirable to wait until a second or later consecutive indication has occurred before making the change. The data will also be immediately corrected by the decoder. Note that this code will not correct N−1=5 errors, so one cannot simply leave data inverted but must have the phase adjuster in order to have protection against random errors, in combination with phase errors.

It will be obvious that this principle can be applied with many other codes. The basic principle comprises using M−1 syndromes to detect M−1 out-of-phase conditions in an M-ary signaling scheme. It will also be obvious that other decision rules could be formulated such as three indications in a row, or two out of three indications in a row and that the optimum rule depends on the statistics and performance requirements of the particular application.

While particular embodiments of the present invention have been shown and described, it should be clear that changes and modifications may be made to such embodiments without departing from the true spirit of the invention. It is intended that the appended claims cover all such changes and modifications.

I claim:

1. An apparatus for use in processing coded signals, comprising:

a demodulator having an input port and an output port, for converting a transmitted data stream into coded format;

a phase adjuster coupled to the output port of the demodulator, for adjusting the phase of the coded data in response to an enabling signal;

a decoder having an input port and an output port, coupled to the output port of the phase adjuster for determining the data bits from code words containing redundant information, and also outputting a syndrome reflective of the error pattern;

logic means, having an input port and an output port and coupled to the output port of the decoder, for comparing the syndromes of decoded information blocks to predetermined syndromes reflective of out-of-phase data conditions; and a decision rule enabler having an input signal from the logic means and having its output signal coupled to the phase adjuster, that corrects M−1 out-of-phase conditions using M−1 syndromes in a M-ary signalling scheme wherein an out-of-phase condition is subjected to comparison rules over two or more code words before correcting the phase of the demodulated data stream.

2. The apparatus of claim 1, wherein the decoder provides syndromes that serve as correction of out-of-phase conditions.

3. The apparatus of claim 1, wherein the decoder provides syndromes that serve as correction for random errors.

4. An apparatus for use in processing coded signals, comprising:

a demodulator having an input port and an output port, for converting a transmitted data stream into coded format;

a phase adjuster coupled to the output port of the demodulator, for inverting the phase of the coded data in response to an enabling signal;

a decoder having an input port and an output port, coupled to the output port of the phase adjuster for determining the data bits from code words containing redundant information, and also outputting a syndrome reflective of the error pattern;

logic means, having an input port and an output port and coupled to the output port of the decoder, for comparing the syndromes of decoded information blocks to a predetermined syndrome reflective of data inversion conditions; and a decision rule enabler having an input signal from the logic means and having its output signal coupled to the phase adjuster, that in response to a detected code condition, inverts the demodulated data stream, prior to subsequent decoding of the same wherein an out-of-phase condition is subjected to comparison rules over two or more code words before inverting the demodulated data stream.

5. The apparatus of claim 4, wherein the decoder provides syndromes that serve as correction of inverted data.

6. The apparatus of claim 4, wherein the decoder provides syndromes that serve as correction for random errors.

7. An apparatus for use in processing coded signals, comprising:

a demodulator having an input port and an output port for converting a transmitted data stream into coded format;

a phase adjuster coupled to the output port of the demodulator, for adjusting the phase of the coded data in response to an enabling signal;

a decoder having an input port and an output port, coupled to the output port of the phase adjuster for removing code bits that are not reflective of the transmitted information;

logic means, having an input port and an output port and coupled to the output port of the decoder, for comparing the syndromes of decoded information blocks to predetermined syndromes reflective of out-of-phase data conditions;

storage means coupled to the logic means for storing predetermined code syndromes and providing the same to an input port of the logic means; and a decision rule enabler having an input signal from the logic means and having its output signal coupled to the phase adjuster, that in response to a detected code condition, corrects the phase of demodulated data stream, prior to subsequent decoding of the same wherein an out-of-phase condition is subjected to comparison rules over two or more code words before correcting the phase of the demodulated data stream.

8. The apparatus of claim 7, wherein the decoder provides syndromes that serve as correction of out-of-phase conditions.

9. The apparatus of claim 7, wherein the decoder provides syndromes that serve as correction for random errors.

* * * * *